United States Patent [19]

Yerman

[11] 4,198,444
[45] * Apr. 15, 1980

[54] METHOD FOR PROVIDING SUBSTANTIALLY HERMETIC SEALING MEANS FOR ELECTRONIC COMPONENTS

[75] Inventor: Alexander J. Yerman, Scotia, N.Y.

[73] Assignee: General Electric Company, Schenectady, N.Y.

[*] Notice: The portion of the term of this patent subsequent to Apr. 12, 1994, has been disclaimed.

[21] Appl. No.: 963,063

[22] Filed: Nov. 22, 1978

Related U.S. Application Data

[63] Continuation of Ser. No. 601,838, Aug. 4, 1975, abandoned.

[51] Int. Cl.$^2$ ............... B05D 5/12; C23C 11/00; H01L 23/28
[52] U.S. Cl. ............... 427/95; 427/93; 427/248.1; 427/255.3; 427/255.7
[58] Field of Search ......... 427/93, 95, 248 R, 248 C, 427/248 J

[56] References Cited

U.S. PATENT DOCUMENTS

| | | | |
|---|---|---|---|
| 2,961,350 | 11/1960 | Flaschen et al. | 174/52 PE |
| 3,034,079 | 5/1962 | Uhlir | 357/73 |
| 3,053,698 | 9/1962 | Ogle et al. | 427/419 B |
| 3,255,395 | 6/1966 | Fabricus | 174/52 PE |
| 3,325,450 | 6/1967 | Holub | 260/46.5 |
| 3,415,680 | 12/1968 | Perri et al. | 357/73 |
| 3,424,956 | 1/1969 | Sato et al. | 357/54 |
| 3,440,959 | 4/1969 | Wagner | 427/248 R |
| 3,447,975 | 6/1969 | Pilo et al. | 357/54 |
| 3,496,435 | 2/1970 | Manley | 338/262 |
| 3,551,176 | 12/1970 | Hlista | 427/93 |
| 3,553,282 | 1/1971 | Holub | 260/824 |
| 3,560,810 | 2/1971 | Balk et al. | 427/93 |
| 3,598,784 | 8/1971 | Holub et al. | 260/46.5 |
| 3,615,913 | 10/1971 | Shaw | 357/54 |
| 3,632,433 | 1/1972 | Tokuyama et al. | 357/73 |
| 3,740,305 | 6/1973 | Hoback et al. | 161/183 |
| 3,849,187 | 11/1974 | Fetscher et al. | 357/72 |
| 3,850,687 | 11/1974 | Kern | 427/95 |
| 3,996,602 | 12/1976 | Goldberg et al. | 357/72 |
| 4,005,240 | 1/1977 | Schlacter | 427/74 |
| 4,017,340 | 4/1977 | Yerman | 427/82 |
| 4,030,948 | 6/1977 | Berger | 148/186 |
| 4,040,083 | 8/1977 | Saiki et al. | 357/72 |

*Primary Examiner*—James R. Hoffman
*Attorney, Agent, or Firm*—Donald M. Winegar; James C. Davis, Jr.; Leo I. MaLossi

[57] ABSTRACT

A glass layer is preferably chemically vapor deposited on a suitable polymer layer of protective coating material to provide an hermetic encapsulation means for a semiconductor element.

25 Claims, 2 Drawing Figures

METHOD FOR PROVIDING SUBSTANTIALLY HERMETIC SEALING MEANS FOR ELECTRONIC COMPONENTS

This is a continuation, of application Ser. No. 601,838, filed Aug. 4, 1975 and now abandoned.

BACKGROUND OF THE INVENTION

1. Field of the Invention

This invention relates to a method for providing a hermetic encapsulation means for a semiconductor element.

2. Description of the Prior Art

Heretofore, some prior art methods provide coating at least preselected exposed surface areas of semiconductor elements with electrically insulating oxide materials. Such coatings are thin layers and have virtually no resistance to mechanical abrasion and require relatively expensive processing equipment. In almost all instances a second and a thicker coat of a protective coating material is provided to protect the initial electrically insulating material. Silicone greases, varnishes, rubbers and resins which are employed as the overcoating of protective material have been found lacking in desirable physical characteristics.

Robert R. Shaw in U.S. Pat. No. 3,615,913, granted on Oct. 26, 1971, teaches the employment of a coating of a cured, protective coating material selected from the group consisting of polyimides, and polyamide-polyimides disposed on exposed end portions of at least one P-N junction to provide passivation thereof. Although these materials exhibited good abrasion resistance properties, the passivation requirements of the semiconductor element still required improvements to be made thereto.

There is currently wide spread use of oxide/glass layers for passivation and encapsulation of semiconductor devices where device stability and long life are important considerations. However, if the glassy layer must be applied after aluminum metallization, (a wide spread requirement), the choice of suitable glass systems is severely circumscribed by a maximum permissible application temperature of ~577° C. This restriction is set by the aluminum-silicon eutectic and must be carefully observed in all processing operations following aluminization of the silicon.

Several glass coating methods are currently in use. These include chemical vapor deposition (CVD), glass frits, and spin-on glass forming alcoholates. The last method is only capable of forming very thin layers, of the order of 2000 Å, of glasses which tend to be more reactive than desirable and, therefore, are of restricted utility in packaging. Glass frits are widely used in packaging but are not usually employed for surface passivation because of difficulties in formulating glasses with an adequate expansion match to silicon, and which are at the same time suitable passivants and chemically stable. CVD methods permit adequate thickness, a wide choice of composition, expansion matching, etc. but difficulties in controlling sodium contamination in CVD reactors have made it difficult to obtain acceptable passivation layers by direct deposition onto bare silicon. This method is, therefore, usually restricted to use as an overcoating of $SiO_2$ and metallization layers. None of these methods in their current state of development is considered capable of providing a reliable passivation/encapsulation method for large thyristors and other power semiconductor devices.

The processing of such devices usually requires surface passivation of bare silicon p-n junctions with aluminum contacts already in place on the silicon. Thus the above-mentioned temperature restrictions on processing apply. Additionally, however, one must concern oneself with the surface charge of the passivation layer when it is directly applied to bare silicon. Such charge can be fixed and positive as in the case of a clean grown thermal oxide, or mobile e.g. when due to the presence of sodium ion contamination of the oxide. Certain proprietary glass compositions give a negative fixed charge when applied to silicon.

Within limits, on some devices, an appropriate surface charge can be beneficial. For example, in the case of a $p^+n$ diode under reverse bias conditions, a negative surface charge will tend to deplete the surface of the n-type material, spread the depletion layer near the surface and hence lower surface electric field thus supressing surface breakdown. On a p $n^+$ diode, positive surface charge could have a similar beneficial effect if certain limits are not exceeded. Too much surface charge can cause surface inversion and channeling with a concommittant increase in surface leakage which is intolerable.

In many power devices, e.g. such as high voltage D.C. thyristors, the edges of the device are tapered or beveled in order to reduce surface fields and suppress surface breakdown. Since such devices are designed to block in both forward or reverse directions when not turned on by the control gate, one encounters the situation that on alternate half cycles maximum surface fields can exist on either side of lightly doped p-n junctions comprising the device and any surface charge will be deleterious favoring surface breakdown in either forward or reverse blocking conditions.

In such cases the most favorable surface coating is one which is charge neutral or nearly so. Currently, there are no known passivation coatings involving glasses or silicon oxides capable of giving such a desired charge neutral surface.

Therefore, it is an object of this invention to provide a new and improved passivation process for semiconductor elements which overcomes the deficiencies of the prior art.

Another object of this invention is to provide a new and improved hermetic encapsulation means for a semiconductor element.

A further object of this invention is to provide a method for coating a protective coating material with a layer of glass to provide a means for hermetically sealing a semiconductor element.

Other objects of this invention will, in part, be obvious and will, in part, appear hereinafter.

SUMMARY OF THE INVENTION

In accordance with the teachings of this invention, there is provided a method for substantially hermetically sealing an electronic component within a suitable polymer material upon which a layer of glass is deposited. The layer of polymer material is deposited on selected surface areas of the electronic component, preferably the polymer is one which adheres well to the surface upon which it is deposited. Additionally, the polymer has good adherence to the layer of glass which is deposited thereon thereafter.

Although the glass layer may be deposited on the polymer by any suitable means, chemical vapor deposition of the same is preferred. Borosilicate glass and phosphosilicate glasses are suitable glasses for depositing polymer material. A layer of silicon dioxide glass may also be provided as an overcoating for the first glass layer.

DESCRIPTION OF THE INVENTION

Figure 1:
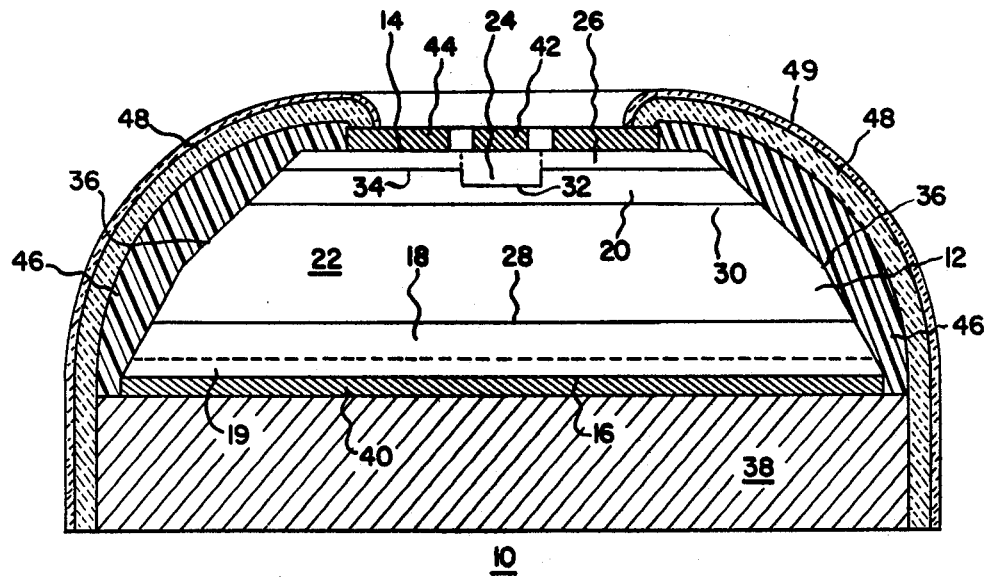
FIGS. 1 and 2 are side elevation views, in cross-section, of semiconductor elements embodying the novel structure of this invention.

With reference to FIG. 1, there is shown a semiconductor element 10 comprised of a body 12 of semiconductor material. The body 12 is prepared by suitable means, such, for example, as by polishing and lapping to parallelism two opposed surfaces 14 and 16. The body 12 has two or more regions of opposite type conductivity and a P-N junction formed by the abutting surfaces of each pair of regions of opposite type conductivity. The end portion of at least one P-N junction is exposed in a surface of the body 12. The body 12 comprises a suitable semiconductor material such, for example, as silicon, silicon carbide, germanium, compounds of Group II and Group VI elements.

In order to more fully describe the invention and for no other purpose, the body 12 will be described as being comprised of silicon semiconductor material having five regions of conductivity and four P-N junctions. Such a configured element 10 may function as a thyristor. Therefore, the body 12 has regions 18 and 20 or P-type conductivity, region 19 of P+ type conductivity and regions 22, 24, and 26 of N-type conductivity. P-N junctions 28, 30, 32 and 34 are formed by the abutting surfaces of the respective pairs of regions 18 and 22, 22 and 20, 20 and 24, and 20 and 26 of opposite type conductivity.

One means of controlling the surface electric field on such a controlled rectifier is to contour the side surface 36 after affixing the partially processed body 12 to a large area contact, or support electrode, 38 by a layer 40 of a suitable ohmic electric solder. Electrical contacts 42 and 44 are affixed to the respective regions 24 and 26. As illustrated, the contouring of the surface 36 results in the well known "double level" surface.

Figure 2:
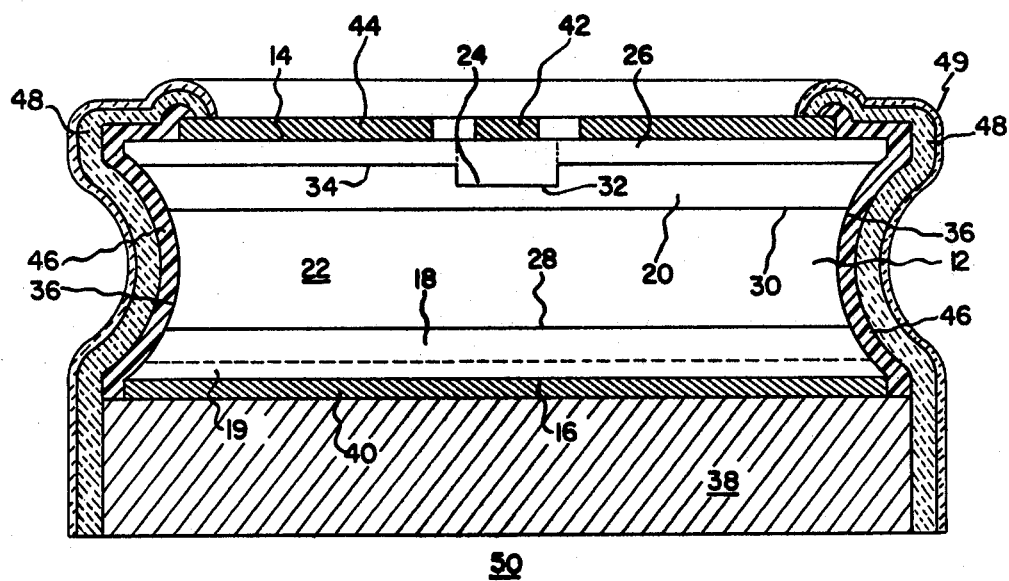

Referring now to FIG. 2, there is shown a semiconductor element 50 embodying a double positive bevel configuration for controlling surface electric field. All items denoted by the same reference numbers as those in element 10 of FIG. 1 are the same, and function in the same manner, as the corresponding item in element 10. The element 50 functions as a thyristor for the configuration illustrated.

Regardless of the method employed to control the surface electric field, selected end portions of at least some of the P-N junctions are exposed at surface areas of the body 12. It is necessary therefore to apply a suitable material to protect the exposed end portions of the P-N junctions.

A layer 46 of a protective coating material is disposed on at least the surface 36 and the exposed end portion of at least the P-N junctions 28 and 30. It is desirable that the material of the layer 46 adhere to the surface 36 as well as to the material of the layer 44 and the contact, or support electrode 38. The material of the layer 46 must also be capable of withstanding an elevated temperature for periods of time necessary to deposit glass materials by chemical vapor deposition or other techniques upon the layer 46. Additionally, the material of the layer 46 must be capable of providing, when cured, an adherent bond between the vapor deposited glass and itself and should exhibit good abrasion resistance, as well as resistance to the chemical reagents utilized in completing the fabrication of the element 10. Further, the material comprising the layer 46 must not exhibit any outgassing of the polymer during deposition of the glass of the layer 48. Additionally, the material of layer 46 should have a low glass transition temperature so as not to cause too great a strain to be retained in the layer 46 which may cause the layer 46 to lift away from the surface 36. A desirable range of glass transition temperature is from about 150° C. to 350° C., with a preferred value of ~200° C.

A protective coating material such, for example, as a polyimide-silicone copolymer has been found to be such a desirable material when disposed on at least the surface 36 and the exposed end portion of at least the P-N junctions 28 and 30.

The protective coating material may be disposed on the surface 36 as a polymer precurser dissolved in a suitable solvent. Upon heating, the solvent is evaporated and the protective coating material of the layer 46 is polymerized in situ on the surface 36 and the end portion of at least one P-N junction. Preferably, the material of the layer 46 is applied to the preselected surface area of the surface 36 of the body 12 as a solution of a soluble polymeric intermediate. Application of the material to at least the surface 36 of the body 12 is by such suitable means as spraying, spinning, brushing and the like. The body 12 with the applied protective coating material is then heated to convert the resinous soluble polymer intermediate to a cured, solid, and selectively insoluble material.

A suitable material for comprising the layer 46 and meeting the aforesaid requirements in the reaction product of a silicon-free organic diamine, an organic tetracarboxylic dianhydride and a polysiloxane diamine, in a suitable organic solvent to yield a copolymer having recurring structural units of the formula:

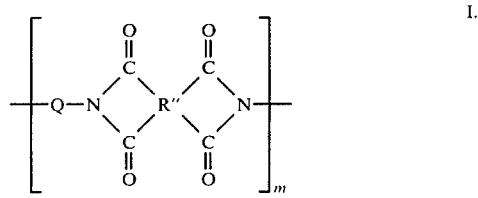

I.

with from 5 to 50 mol percent intercondensed structural units of the formula:

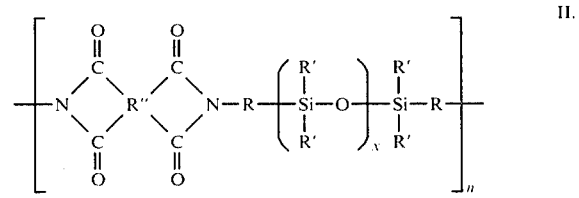

II.

wherein R is a divalent hydrocarbon radical, R' is a monovalent hydrocarbon radical, R" is a tetravalent organic radical, Q is a divalent silicon-free organic radical which is the residue of an organic diamine, x is a whole number equal to at least 1 and advantageously from 1 to 8 and as high as 1 to 10,000 or more, m and n are the same or different integers greater than 1 and preferably from 10 to 10,000 or more.

The above-mentioned block copolymers can be prepared by effecting reaction, in the proper molar proportions, of a mixture of ingredients comprising a diaminosiloxane of the general formula:

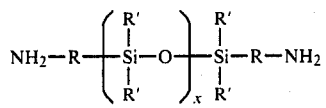
III.

a silicon-free diamino compound of the formula:

NH₂—Q—NH₂    IV.

and a tetracarboxylic acid dianhydride having the formula

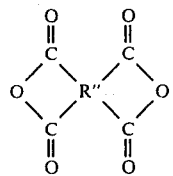
V.

wherein R, R', R'', Q and x have the meanings given above.

Alternatively, a polysiloxane-imide composition may be used with comparable effectiveness by blending together a polyimide composed solely of recurring structural units of Formula I with a polyimide composed solely of recurring structural units of Formula II employing the polyimide of Formula II in such a molar proportion that the structural units of the latter are within the range of from 5 to 50 mol percent of said units based on the total molar concentration of the units of Formula II and the units of Formula I.

It will be recognized that the ultimate polyimide siloxane composition used in the practice of this invention will consist essentially of the imido structures found in Formulas I and II. However, the actual precursor materials resulting from the reaction of the diaminosiloxane, the silicon-free organic diamine and the tetracarboxylic acid dianhydride will initially be in the form of a polyamic acid structure composed of structural units of the formulas:

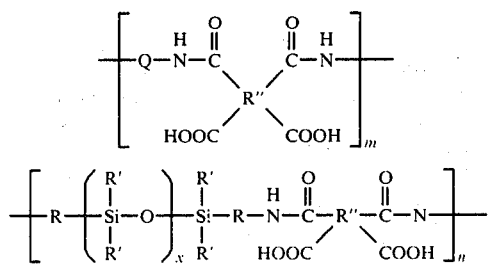

VI.

VII.

where R, R', R'', Q, x, m and n have the meanings given above.

The diamino siloxanes of Formula III which may be used in the practice of the present invention include compounds having the following formulas:

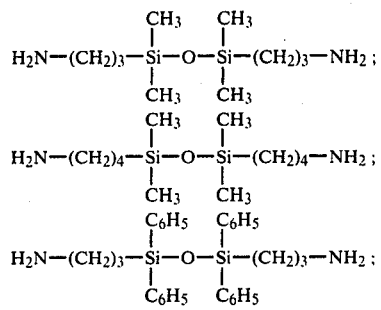

and the like.

The diamines of Formula IV above are described in the prior art and are to a large extent commercially available materials. Typical of such diamines from which the prepolymer may be prepared are the following:
m-phenylenediamine;
p-phenylenediamine;
4,4'-diaminodiphenylpropane;
4,4'-diaminodiphenylmethane;
4,4'-methylenedianiline;
benzidine;
4,4'-diaminodiphenyl sulfide;
4,4'-diaminodiphenyl sulfone;
4,4'-diaminodiphenyl ether;
1,5-diaminophthalene;
3,3'-dimethylbenzidine;
3,3'-dimethoxybenzidine;
2,4-bis(β-amino-t-butyl)toluene;
bis(p-β-amino-t-butylphenyl)ether;
bis(p-β-methyl-o-aminopentyl)benzene;
1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
actamethylenediamine;
3-methoxyhexamethylenediamine;

2,5-dimethylhexamethylenediamine;
2,5-dimethylheptamethylenediamine;
3-methylheptamethylenediamine;
5-methylnonamethylenediamine;
1,4-cyclohexanediamine;
1,12-octadecanediamine;
bis(3-aminopropyl)sulfide;
N-methyl-bis(3-aminopropyl)amine;
hexamethylenediamine;
heptamethylenediamine;
nonamethylenediamine;
and mixtures thereof. It should be noted that these diamines are given merely for the purpose of illustration and are not considered to be all inclusive. Other diamines not mentioned will readily be apparent to those skilled in the art.

The tetracarboxylic acid dianhydrides of Formula V may further be defined in that the R'' is a tetravalent radical, e.g. a radical derived from or containing an aromatic group containing at least 6 carbon atoms characterized by benzenoid unsaturation, wherein each of the 4 carbonyl groups of the dianhydride are attached to a separate carbon atom in the tetravalent radical, the carbonyl groups being in pairs in which the groups in each pair are attached to adjacent carbon atoms of the R'' radical or to carbon atoms in the R'' radical at most one carbon atom removed, to provide a 5-membered or 6-membered ring as follows:

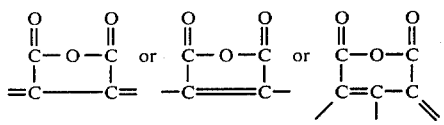

Illustrations of dianhydrides suitable for use in the present invention (with their reference acronym designated in parenthesis) include:
pyromellitic dianhydride (PMDA);
2,3,6,7-naphthalene tetracarboxylic dianhydride;
3,3',4,4'-diphenyl tetracarboxylic dianhydride;
1,2,5,6-hapthalene tetracarboxylic dianhydride;
2,2',3,3'-diphenyl tetracarboxylic dianhydride;
2,2-bis(3,4-dicarboxyphenyl)propanedianhydride;
bis(3,4-dicarboxyphenyl)sulfone dianhydride;
2,2-bis[4-(3,4-dicarboxyphenoxy)phenyl]propane dianhydride (BPA dianhydride);
2,2-bis[4-(2,3-dicarboxyphenoxy)phenyl]propane dianhydride;
benzophenone tetracarboxylic acid dianhydride (BPDA);
perylene-1,2,7,8-tetracarboxylic acid dianhydride;
bis(3,4-dicarboxyphenyl)ether dianhydride, and
bis(3,4-dicarboxyphenyl)methane dianhydride;
and aliphatic anhydrides such as cyclopentane tetracarboxylic dianhydride, cyclohexane tetracarboxylic dianhydride, butane tetracarboxylic dianhydride, etc. The incorporation of other anhydrides, such as trimellitic anhydride, to make amide-imide-siloxane polymers is not precluded.

Application of the block copolymers or blends of polymers in a suitable solvent (including, for example, N-methylpyrrolidone, N,N-dimethylacetamide, N,N-dimethylformamide, etc.) alone or combined with nonsolvents, to the substrate material may be by conventional means such as dipping, spraying, painting, spinning, etc. The block copolymers or blends of polymers may be dried in an initial heating step at temperatures of about 75° to 125° C. for a sufficient time frequently under vacuum to remove the solvent. The polyamic acid is then converted to the corresponding polyimide-siloxane by heating at temperatures of about 150°–300° C. for a sufficient time to effect the desired conversion to the polyimide structure and final cure.

A preferred curing cycle for materials of the above general formula is as follows:
 (a) from 15 to 30 minutes of from 135° C. to 150° C. in dry $N_2$.
 (b) from 15 to 60 minutes at about 185° C.±10° C. in dry $N_2$.
 (c) from 1 to 3 hours at about 225° C. in vacuum.

Alternately, it has been found that one may be able to cure the coating material in other atmospheres such, for example, as air for ease of commercial application of this invention.

Sufficient material is applied to the surface 36 to provide a layer 46 the thickness of which is from 1 micron to 100 microns. The minimum thickness is determined by the requirement that the cured material prevent the penetration of glass through the layer 46 to the silicon of the surface 36.

Other suitable protective coating materials of polyimides, polyamides, polyimide-polyamides, and methods for making the same, all of which embody polysiloxanes are described further in U.S. Pat. Nos. 3,325,450, 3,553,282, 3,598,784 and 3,740,305 which by reference are made part of the disclosures of the instant application. Additionally, polyimides, polyamides and polyimide-polyamides which will at least adhere to the material of the contacts 44 and 38 and withstand the glass deposition temperature are also suitable for comprising the layer 46. Preferably, any polymer material employed should adhere to the semiconductor material and its metallized areas.

The layer 48 of glass is preferably deposited on the layer 46 by chemical vapor deposition. The layer 48 has a thickness of from 1 μm to about 15 μm. In the preferred deposition process, the coated wafers, elements or devices 12 are disposed on a susceptor of a chemical vapor deposition reactor and heated to the glass deposition temperature in an inert atmosphere. An appropriate gas mixture is introduced into the reactor and the layer 48 of glass grown or deposited on the layer 46. Suitable glasses to be vapor deposited are phosphosilicate and borosilicate glasses. For example, a gaseous mixture of diborane, silane and oxygen at a temperature of about 400° C.±50° C. produce a layer 48 of borosilicate glass. A borosilicate glass comprising from 15 to 25 mol percent $B_2O_3$ is desirable. A preferred value for $B_2O_3$ in the glass is 19±2 mol percent. This preferred range of $B_2O_3$ in the glass is desirable to achieve a glass layer 48 the thermal expansion coefficient of which matches that of the silicon body 12 quite well. The glass deposition process is practiced for a sufficient time to provide a thickness of from 1 μm to 10 μm for the layer 48. A preferred thickness is 3 μm.

Alternately a mixture of phosphine, silane and oxygen gases provides a layer 48 of phosphosilicate glass. The temperature of chemical deposition of the same is approximately 325° C. to 475° C. Other suitable glass application processes embody the use of glass frits and spin-on glass forming alcholates.

In order to assure better resistance to chemical attack and further reduce moisture permeability the two layers 46 and 28 can be overcoated with a second glass layer 49. The layer 49 preferably is silox or silicon dioxide deposited at a temperature of about 400° C.±50° C. The process is practiced for a sufficient time to provide a thickness for the layer 49 of from 1000 Å to 5000 Å. A preferred thickness if 2000 Å.

In order to illustrate the teachings of this invention, several devices, each comprising a body of single crystal silicon semiconductor material, about 2" in diameter were prepared in the manner previously described in this specification. A solution of the polymer precurser in the form of the polyamic acid from dissolved in N-methyl-2-pyrrolidone containing 25% solids by weight was disposed on the surface of the body in which end portions of P-N junctions are disposed.

The polymer precurser solution was formed by reacting benzophenone tetracarboxylic acid dianhydride with methylene dianiline and bis($\gamma$-aminopropyl)tetramethyldisiloxane, the latter two diamine materials being present in the molar ratio of 70:30. The reaction was carried out at a temperature of less than 50° C. and using suitably purified and dried materials to favor a large molecular weight polymer.

The protective coating material was cured in three stages of heating. Each coated device or wafer was heated to a temperature of 135° C.±5° C. for 20 minutes in an atmosphere of dry nitrogen gas. At the completion of this process time, the temperature was raised to 185° C.±5° C. and the devices held at temperature in dry nitrogen gas for 30 minutes. Upon completion of this process step, the devices were removed to a vacuum oven and heated to an elevated temperature of about 225° C.±5° C. for from 1 to 3 hours. The devices were removed from the oven and placed on a susceptor in a chemical vapor deposition reactor.

The devices were heated to an elevated temperature of 450° C.±5° C. in an atmosphere of nitrogen. When observed to be at temperature a gas mixture of diborane, silane and oxygen was then introduced into the reactor and caused to flow over the coated devices. The gas flow ratio was as follows:

Diborane—13.5 cc/min. (1.05% in Argon)
Silane—450 cc/min. (5.1% in Argon)
Oxygen—>600 cc/min.

The reaction was continued for about 6 minutes and the diborane gas was turned off but the other gas flows were continued for another two and one-half minutes. The reaction process was then stopped and the devices cooled to room temperature in ~5 minutes.

A visual examination of the devices revealed the glass layers to be of excellent quality. The glass coating was homogeneous and featureless.

The coated devices exhibited excellent resistance to moisture permeability. Additionally, the glass prevented the cured copolymer material from being attacked by the chemicals employed in further processing of the device.

Further examination showed the cured organic copolymer material to adhere tenaciously to both the silicon of the device and to the borosilicate glass deposited thereon. The thickness of the cured copolymer was measured and found to be 3 micrometers. The thickness of the borosilicate layer, when measured, was 4000 Å and that of the silox layer 2000 Å.

As illustrated by the above example, the novel device process of this invention provides a possible means of eliminating the presently employed hermetic packages. This is a significant reduction in the overall cost of the device as sold commercially.

Other advantages achieved by the novel devices and processing techniques includes a significant reduction in surface charge by use of the polymer passivation film while retaining the barrier properties of glass as the outer hermetic layer. In contrast, glass disposed directly on the silicon surface introduces alkali ions, particularly sodium ions, which are free to contaminate the surface of the device. Because of the high electric field which exists in the vicinity of a p-n junction, the ions move about the surface and cause current leakages which degrade the device. Additionally, the glasses of the protective coatings cause surface charges. These surface charges vary the depletion layer shape near the surface upon which they are dispersed on the devices altering surface electric field which can favor voltage breakdown of the devices at the surface so affected.

Therefore, the use of Applicant's novel passivation coating enables one to have a neutral charge coating material on the device surface. Additionally, the coating has excellent adhesion properties relative to both the semiconductor material and the glass disposed on the coating. Chemical vapor deposition of the glass onto the organic copolymer coating is preferred as the composition of the glass can be readily controlled and/or varied during the deposition process.

I claim as my invention:

1. A method for coating selected surface areas of an electronic component comprising the process steps of:
   a. applying a layer of an organic polymer protective coating material having a capability to withstand an elevated temperature of from approximately 325° C. to about 475° C. for a period of time sufficient to chemically vapor deposit at least one layer of glass on the polymer layer and having a low glass transition temperature range of from about 150° C. to 350° C. on a selected surface area of an electronic component and having the ability to bond well to the at least one layer of chemically vapor deposited glass, and
   b. applying by chemical vapor deposition a first layer of a glass material on the layer of protective coating material, wherein the glass material is one selected from the group consisting of borosilicate glass and phosphosilicate glass.

2. The method of claim 1 and including the additional process step of:
   c. applying a second layer of a glass material on the first layer of glass material.

3. The method of claim 2 wherein
   the material of the second layer of glass is silicon dioxide.

4. The method of claim 1 including the process steps for depositing the first glass layer of
   heating the coated electronic component to a temperature of from 325° C. to about 475° C., and
   causing a mixture of selected gases to flow over and about the coated electronic component for a sufficient time to vapor deposit a layer of glass of a predetermined thickness on the layer of protective coating material.

5. The method of claim 4 wherein
   the thickness of the layer of organic polymer protective coating material is from 1 micrometer to 100 microns and
   the polymer coated component is heated to a temperature of about 400° C.±50° C.,
   the mixture of gases comprises diborane, silane, oxygen and argon, and the predetermined thickness of the layer is from one micrometer to 10 micrometers.

6. The method of claim 5 including the additional process step of terminating the flow of diborane gas after achieving the predetermined thickness but continuing the flow of silane, oxygen and argon gases to flow over and about the borosilicate coated component for a sufficient time to grow a layer of silicon dioxide on the layer of borosilicate glass.

7. The method of claim 6 wherein the layer of silicon dioxide is from 1000 Å to 5000 Å in thickness.

8. The method of claim 1 wherein the glass transition temperature is approximately 200° C.

9. A method for coating selected surface areas of an electronic component comprising the process steps of:

a. applying a layer of an organic polymer protective coating material having a capability to withstand an elevated temperature of from approximately 325° C. to about 475° C. for a period of time sufficient to chemically vapor deposit at least one layer of glass on the polymer layer and having a low glass transition temperature range of from about 150° C. to 350° C. on a selected surface area of an electronic component and having the ability to bond well to the at least one layer of chemically vapor deposited glass, the organic polymer protective coating material is a copolymer material which when cured in situ is a reaction product of a silicon-free organic diamine, an organic tetracarboxylic dianhydride and a polysiloxane amine capped material which when cured has the recurring structural units of the formula:

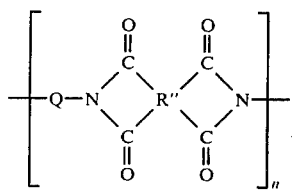

with from 5 to 50 mol percent intercondensed structural units of the formula:

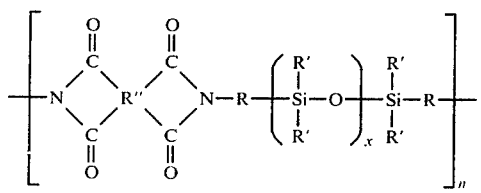

wherein
R is a divalent hydrocarbon radical;
R' is a monovalent hydrocarbon radical;
R" is a tetravalent organic radical;
Q is a divalent silicon-free organic radical which is the residue of an organic diamine;
x is an integer having a value of greater than 1, and
m and n are integers greater than 1,
and b. applying by chemical vapor deposition a first layer of a glass material on the layer of protective coating material, wherein the glass material is one selected from the group consisting of borosilicate glass and phosphosilicate glass.

10. The method of claim 9 wherein the polymeric material, when cured, is the reaction product of benzophenone tetracarboxylic acid dianhydride with methylene dianiline and bis($\gamma$-aminopropyl)tetramethyldisoloxane.

11. The method of claim 10 wherein the bis($\gamma$-aminopropyl)tetramethyldisoloxane is present in the reaction product in the amount of about 30 mol percent.

12. The method of claim 11 and including the additional process step of:

c. applying a second layer of a glass material on the first layer of glass material.

13. The method of claim 12 wherein the material of the second layer of glass is silicon dioxide.

14. The method of claim 11 including the process steps for depositing the first glass layer of heating the coated electronic component to a temperature of from 325° C. to about 475° C., and causing a mixture of selected gases to flow over and about the coated electronic component for a sufficient time to vapor deposit a layer of glass of a predetermined thickness on the layer of protective coating material.

15. The method of claim 14 wherein the thickness of the layer of organic polymer protective coating material is from 1 micrometer to 100 microns and the polymer coated component is heated to a temperature of about 400° C.±50° C., the mixture of gases comprises diborane, silane, oxygen and argon, and the predetermined thickness of the layer is from one micrometer to 10 micrometers.

16. The method of claim 15 including the process step of terminating the flow of diborane gas after achieving the predetermined thickness but continuing the flow of silane, oxygen and argon gases to flow over and about the borosilicate coated component for a sufficient time to grow a layer of silicon dioxide on the layer of borosilicate glass.

17. The method of claim 15 wherein the practice of depositing the layer of silicon dioxide is practiced for a sufficient time to form a layer of from 1000 Å to 5000 Å in thickness.

18. The method of claim 15 wherein the first layer of glass is a borosilicate glass comprising from 15 to 25 mol percent of $B_2O_3$.

19. The method of claim 18 wherein the mol percent of $B_2O_3$ is 19±2.

20. The method of claim 19 including the additional process step of terminating the flow of diborane gas after achieving the predetermined thickness but continuing the flow of silane, oxygen and argon gases to flow over and about the borosilicate coated component for a sufficient time to grow a layer of silicon dioxide on the layer of borosilicate glass.

21. The method of claim 9 and including the additional process step of:

c. applying a second layer of a glass material on the first layer of glass material.

22. The method of claim 21 wherein the material of the second layer of glass is silicon dioxide.

23. The method of claim 9 including the process steps for depositing the first glass layer of
heating the coated electronic component to a temperature of from 325° C. to about 475° C., and
causing the mixture of selected gases to flow over and about the coated electronic component for a sufficient time to vapor deposit a layer of glass of a predetermined thickness on the layer of protective coating material.

24. The method of claim 23 wherein
the thickness of the layer of organic polymer protective coating material is from 1 micrometer to 100 microns and
the polymer coated component is heated to a temperature of about 400° C.±50° C.,
the mixture of gases comprises diborane, silane, oxygen and argon, and
the predetermined thickness of the layer is from one micrometer to 10 micrometers.

25. The method of claim 24 including the additional process step of
terminating the flow of diborane gas after achieving the predetermined thickness but continuing the flow of silane, oxygen and argon gases to flow over and about the borosilicate coated component for a sufficient time to grow a layer of silicon dioxide on the layer of borosilicate glass.

* * * * *